(12) United States Patent
Zhan

(10) Patent No.: US 9,893,091 B2
(45) Date of Patent: Feb. 13, 2018

(54) ARRAY SUBSTRATE AND FABRICATING METHOD THEREOF, DISPLAY PANEL AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventor: Hongming Zhan, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/771,094

(22) PCT Filed: Nov. 19, 2014

(86) PCT No.: PCT/CN2014/091555
§ 371 (c)(1),
(2) Date: Aug. 27, 2015

(87) PCT Pub. No.: WO2016/029564
PCT Pub. Date: Mar. 3, 2016

(65) Prior Publication Data
US 2016/0064415 A1    Mar. 3, 2016

(30) Foreign Application Priority Data

Aug. 29, 2014    (CN) .......................... 2014 1 0438637

(51) Int. Cl.
*H01L 29/22*    (2006.01)
*H01L 27/12*    (2006.01)
*H01L 27/32*    (2006.01)

(52) U.S. Cl.
CPC ........ *H01L 27/124* (2013.01); *H01L 27/1244* (2013.01); *H01L 27/1248* (2013.01);
(Continued)

(58) Field of Classification Search
CPC ............... H01L 27/124; H01L 27/1244; H01L 27/1248; H01L 27/3248; H01L 27/326; G09G 2300/0426
(Continued)

(56) References Cited

U.S. PATENT DOCUMENTS 9,196,640 B2 * 11/2015 Xu ...................... H01L 27/1255
2014/0054581 A1 * 2/2014 Song ..................... G02F 1/1343
257/43
(Continued)

FOREIGN PATENT DOCUMENTS

| CN | 102981335 A | 3/2013 |
|---|---|---|
| CN | 202948925 U | 5/2013 |

(Continued)

OTHER PUBLICATIONS

International Search Report and Written Opinion both dated May 6, 2015; PCT/CN2014/091555.
(Continued)

*Primary Examiner* — Matthew E Warren
(74) *Attorney, Agent, or Firm* — Ladas & Parry LLP; Loren K. Thompson

(57) ABSTRACT

An array substrate and a fabricating method thereof, a display panel and a display apparatus are disclosed. The array substrate includes a base substrate and a gate metal layer, a gate insulating layer, an active layer, a source-drain electrode metal layer, a passivation layer and a common electrode layer which are sequentially formed on the base substrate, as well as a pixel electrode layer which is positioned between the active layer and the source-drain elec-
(Continued)

trode metal layer or between the source-drain electrode metal layer and the passivation layer; the gate metal layer including a gate electrode and a common electrode line. The pixel electrode layer or the source-drain electrode metal layer includes a connecting electrode, the connecting electrode being electrically connected with the common electrode line through a first via hole in the gate insulating layer, and the connecting electrode being electrically connected with the common electrode of the common electrode layer through a second via hole in the passivation layer.

20 Claims, 3 Drawing Sheets

(52) U.S. Cl.
CPC ........ *H01L 27/326* (2013.01); *H01L 27/3248* (2013.01); *G09G 2300/0426* (2013.01)

(58) Field of Classification Search
USPC .............................................. 257/59, 72, 99
See application file for complete search history.

(56) References Cited

U.S. PATENT DOCUMENTS

| | | |
|---|---|---|
| 2014/0131717 A1 | 5/2014 | Ql et al. |
| 2015/0325705 A1 | 11/2015 | Choi et al. |
| 2015/0333182 A1 | 11/2015 | Guo |
| 2016/0013210 A1* | 1/2016 | Li ........................ H01L 27/124 257/72 |
| 2016/0276378 A1* | 9/2016 | Bai ....................... H01L 27/124 |

FOREIGN PATENT DOCUMENTS

| | | |
|---|---|---|
| CN | 103208491 A | 7/2013 |
| CN | 203117620 A | 8/2013 |
| CN | 103309108 A | 9/2013 |
| CN | 104037126 A | 9/2014 |

OTHER PUBLICATIONS

First Chinese Office Action dated Sep. 18, 2016; Appln. No. 201410438637.9.

* cited by examiner

ARRAY SUBSTRATE AND FABRICATING METHOD THEREOF, DISPLAY PANEL AND DISPLAY APPARATUS

TECHNICAL FIELD

Embodiments of the present disclosure relate to an array substrate and a fabricating method thereof, a display panel and a display apparatus.

BACKGROUND

A thin film transistor liquid crystal display (TFT-LCD) is a comparatively ideal display device due to advantages of small size, low power consumption, no radiation and so on. In recent years, the scope of application of TFT-LCDs in the display field is gradually enlarged, and relevant technologies are developed rapidly. Displays of a high aperture ratio Advanced-super Dimensional Switching (HADS) mode have been widely applied to various display products due to advantages of wide viewing angle, low color cast and so on.

As shown in FIG. 1, an array substrate of an HADS technology in the state of art comprises a base substrate 1a, a gate electrode 2a, a common electrode line 3a, a gate insulating layer 4a, an active layer 5a, a pixel electrode 6a, a drain electrode 8a, a source electrode 7a, a data line 9a, a passivation layer 10a, and a common electrode 11a; the common electrode 11a is electrically connected with the common electrode line 3a through a via hole 20a. It can be seen from FIG. 1, the via hole 20a is a via hole penetrating through both the gate insulating layer 4a and the passivation layer 10a. When the array substrate is designed, in order to reduce coupling capacitance between the common electrode 11a and the data line 9a, the passivation layer 10a is required to be made thicker, and therefore, to ensure effectiveness of the via hole 20a, a hole depth of the via hole 20a is enough large and the size of the via hole is relatively large. However, the relatively large hole depth and size of the via hole 20a make the coating process of a subsequent fabricating process be difficulty controlled and easily invoke moires on a coated film layer, thereby affecting the yield of the fabricated array substrates.

SUMMARY

According to an embodiment of the present disclosure, there is provided an array substrate. The array substrate comprises a base substrate and a gate metal layer, a gate insulating layer, an active layer, a source-drain electrode metal layer, a passivation layer and a common electrode layer which are sequentially formed on the base substrate, as well as a pixel electrode layer which is positioned between the active layer and the source-drain electrode metal layer or between the source-drain electrode metal layer and the passivation layer; the gate metal layer including a gate electrode and a common electrode line. The pixel electrode layer or the source-drain electrode metal layer includes a connecting electrode, the connecting electrode is electrically connected with the common electrode line through a first via hole in the gate insulating layer, and the connecting electrode is electrically connected with a common electrode of the common electrode layer through a second via hole in the passivation layer.

For example, the connecting electrode is in direct contact with the gate insulating layer and the passivation layer.

For example, vertical projections of the first via hole and the second via hole on the base substrate are mutually staggered, a position of the first via hole corresponds to that of the common electrode line, a position of the second via hole corresponds to that of the common electrode, and the vertical projections of the first via hole and the second via hole on the base substrate fall within a scope of a vertical projection of the connecting electrode on the base substrate.

For example, the connecting electrode is positioned in the pixel electrode layer, and the connecting electrode is mutually insulated from a pixel electrode of the pixel electrode layer.

For example, the connecting electrode is positioned in the source-drain electrode metal layer, and the connecting electrode is mutually insulated from a source electrode, a drain electrode and a data line of the source-drain electrode metal layer.

According to an embodiment of the present disclosure, there is provided a display panel. The display panel comprises the array substrate as described above.

According to an embodiment of the present disclosure, there is provided a display apparatus. The display apparatus comprises the display panel as described above.

According to an embodiment of the present disclosure, there is provided a fabricating method of an array substrate. The fabricating method comprises: sequentially forming a gate metal layer, a gate insulating layer, an active layer, a source-drain electrode metal layer, a passivation layer and a common electrode layer on a substrate, and forming a pixel electrode layer between the active layer and the source-drain electrode metal layer or between the source-drain electrode metal layer and the passivation layer, the gate metal layer including a gate electrode and a common electrode line. The fabricating method further comprises: forming a connecting electrode in the pixel electrode layer or the source-drain electrode metal layer, forming a first via hole in the gate insulating layer, and firming a second via hole in the passivation layer, the connecting electrode being electrically connected with the common electrode line through the first via hole in the gate insulating layer, and the connecting electrode being electrically connected with a common electrode of the common electrode layer through the second via hole in the passivation layer.

For example, the fabricating method of the array substrate comprises: sequentially forming the gate metal layer on the base substrate, the gate metal layer including a gate electrode and the common electrode line; sequentially forming the gate insulating layer and the active layer on the gate metal layer; forming the first via hole in a region of the gate insulating layer outside the active layer, a position of the first via hole corresponding to that of the common electrode line; forming the pixel electrode layer including a pixel electrode and the connecting electrode on the base substrate, the connecting electrode being electrically connected with the common electrode line through the first via hole; forming the source-drain electrode metal layer including a source electrode, a drain electrode and a data line on the base substrate; forming, the passivation layer on the base substrate, the passivation layer including the second via hole corresponding to the connecting electrode; forming, the common electrode layer including the common electrode on the base substrate, the common electrode being electrically connected with the connecting electrode through the second via hole.

For example, the fabricating method of the array substrate comprises: sequentially forming the gate metal layer on the base substrate, the gate metal layer including a gate electrode and the common electrode line; sequentially forming the gate insulating layer and the active layer on the gate metal layer; forming the first via hole in a region of the gate insulating layer outside the active layer, a position of the first via hole corresponding to that of the common electrode line; forming the source-drain electrode metal layer including a source electrode, a drain electrode, a data line and the connecting electrode on the base substrate, the connecting electrode being electrically connected with the common electrode line through the first via hole; forming the pixel electrode layer including a pixel electrode on the base substrate; forming the passivation layer on the base substrate, the passivation layer including the second via hole corresponding to the connecting electrode; forming the common electrode layer including the common electrode on the base substrate, the common electrode being electrically connected with the connecting electrode through the second via hole.

For example, the fabricating method of the array substrate comprises: sequentially forming the gate metal layer on the base substrate, the gate metal layer including a gate electrode and the common electrode line; forming a gate insulating layer, an active layer and a pixel electrode layer including a pixel electrode on the gate metal layer; forming the first via hole in a region of the gate insulating layer, a position of the first via hole corresponding to that of the common electrode line; forming the source-drain electrode metal layer including a source electrode, a drain electrode, a data line and the connecting electrode on the base substrate, the connecting electrode being electrically connected with the common electrode line through the first via hole; forming a passivation layer on the base substrate, the passivation layer including the second via hole corresponding to the connecting electrode; forming a common electrode layer including the common electrode on the base substrate, the common electrode being electrically connected with the connecting electrode through the second via hole.

For example, the fabricating method of the array substrate comprises: sequentially forming the gate metal layer on the base substrate, the gate metal layer including a gate electrode and the common electrode line; forming the gate insulating layer the active layer, and the source-drain electrode metal layer including a source electrode, a drain electrode and a data line on the gate metal layer; forming the first via hole in a region of the gate insulating layer outside the active layer and the data line, a position of the first via hole corresponding to that of the common electrode line; forming the pixel electrode layer including a pixel electrode and the connecting electrode on the base substrate, the connecting electrode being electrically connected with the common electrode line through the first via hole; forming the passivation layer on the base substrate, the passivation layer including the second via hole corresponding to the connecting electrode; forming a common electrode layer including the common electrode on the base substrate, the common electrode being electrically connected with the connecting electrode through the second via hole.

For example, the connecting electrode is mutually insulated from the pixel electrode.

For example, the connecting electrode is mutually insulated from the source electrode, the drain electrode and the data line.

For example, vertical projections of the first via hole and the second via hole on the base substrate are mutually staggered, and the vertical projections of the first via hole and the second via hole on the base substrate fall within a scope of a vertical projection of the connecting electrode on the base substrate.

BRIEF DESCRIPTION OF THE DRAWINGS

In order to more clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
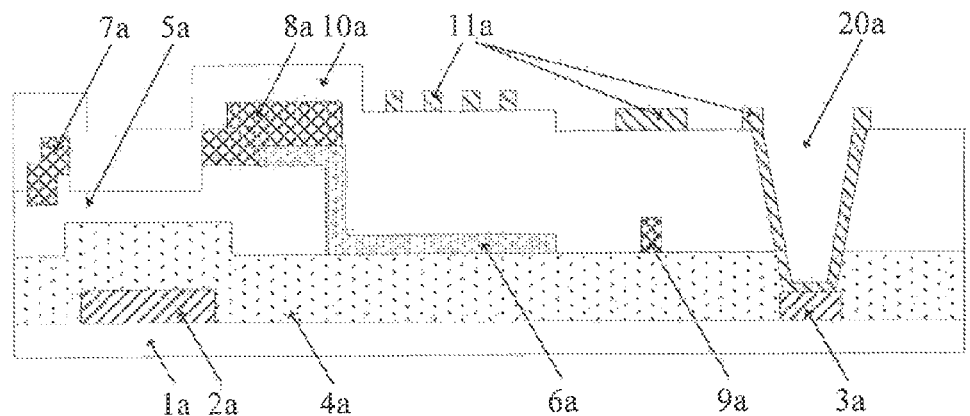
FIG. 1 is a structural schematic diagram of an array substrate of an HADS mode in the state of art.

In order to make objects, technical details and advantages of the embodiments of the present disclosure apparent, the technical solutions of the embodiments will be described below in a clearly and fully understandable way in connection with the drawings. It is obvious that the described embodiments are just a part but not all of the embodiments of the present disclosure. Based on the described embodiments of the present disclosure, those ordinarily skilled in the art can obtain other embodiment(s), without any inventive work, which should be within the protective scope of the present disclosure.

An embodiment of the present disclosure provides an array substrate, which comprises a base substrate and a gate metal layer, a gate insulating layer, an active layer, a source-drain electrode metal layer, a passivation layer, and a common electrode layer which are sequentially formed on the base substrate, as well as a pixel electrode layer which is positioned between the active layer and the source-drain electrode metal layer or between the source-drain electrode metal layer and the passivation layer; the gate metal layer includes a gate electrode and a common electrode line.

The pixel electrode layer or the source-drain electrode metal layer includes a connecting electrode, the connecting electrode is electrically connected with the common electrode line through a first via hole in the gate insulating layer, and the connecting electrode is electrically connected with a common electrode of the common electrode layer through a second via hole in the passivation layer.

In the embodiment of the present disclosure, with the connecting electrode arranged on the pixel electrode layer or the source-drain electrode metal layer, the connecting electrode is electrically connected with the common electrode line through the first via hole, and the common electrode of the common electrode layer is electrically connected with the connecting electrode through the second via hole, so that an electrical connection between the common electrode and the common electrode line is established. Because the first via hole and the second via hole are electrically connected by the connecting electrode, hole depths and sizes of the first via hole and the second via hole are reduced in comparison with those of a continuous via hole directly penetrating through both the gate insulating layer and the passivation layer, the influence on the coated film layer in the subsequent fabricating process is reduced, and moires are prevented from being produced on the coated film layer.

In this embodiment, the connecting electrode is in direct contact with the gate insulating layer and the passivation layer, and is electrically connected with the common electrode line and the common electrode respectively through the first via hole in the gate insulating layer and the second via hole in the passivation layer. For example, vertical projections of the first via hole and the second via hole on the base substrate are mutually staggered, the position of the first via hole corresponds to that of the common electrode line, the position of the second via hole corresponds to that of the common electrode, and the vertical projections of the first via hole and the second via hole on the base substrate fall within the scope of a vertical projection of the connecting electrode on the base substrate. Because the vertical projections of the first via hole and the second via hole are in different positions, they are not mutually influenced.

For example, the connecting electrode is positioned in the pixel electrode layer, and the connecting electrode is mutually insulated from the pixel electrode in the pixel electrode layer. Or, the connecting electrode is positioned in the source-drain electrode metal layer, and the connecting electrode is mutually insulated from a source electrode, a drain electrode and a data line in the source-drain electrode metal layer.

Hereinafter, the array substrate provided in an embodiment of the present disclosure will be illustrated in more detail with reference to the accompanying drawings.

Figure 2:
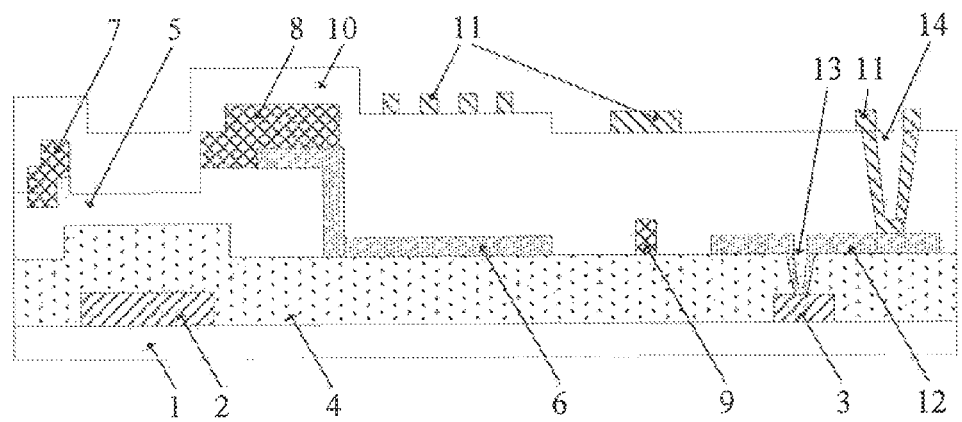
FIG. 2 is a structural schematic diagram of a first array substrate provided in an embodiment of the present disclosure.

With reference to FIG. 2, an array substrate provided in an embodiment of the present disclosure comprises a base substrate 1, and a gate metal layer, a gate insulating layer 4, an active layer 5, a pixel electrode layer, a source-drain electrode metal layer, a passivation layer 10 and a common electrode layer which are sequentially formed on the base substrate 1; the gate metal layer includes a gate electrode 2 and a common electrode line 3; the pixel electrode layer includes a pixel electrode 6; the source-drain electrode metal layer includes a source electrode 7, a drain electrode 8 and a data line 9; the common electrode layer includes a common electrode 11; and the source electrode 7, the drain electrode 8, the gate electrode 2 and the active layer 5 form a Thin Film Transistor (TFT).

The pixel electrode layer further includes a connecting electrode 12, the connecting electrode 12 is electrically connected with the common electrode line 3 through a first via hole 13 in the gate insulating layer, and the connecting electrode 12 is electrically connected with the common electrode 11 of the common electrode layer through a second via hole 14 in the passivation layer. In this embodiment, the connecting electrode 12 and the pixel electrode 6 are arranged in a same layer.

According to FIG. 2, the connecting electrode 12 is in direct contact with the gate insulating layer 4 and the passivation layer 10 and is arranged outside a region of the active layer 5 and the pixel electrode 6.

Vertical projections (not shown) of the first via hole 13 and the second via hole 14 on the base substrate 1 are mutually staggered, the position of the first via hole 13 corresponds to that of the common electrode line 3, the position of the second via hole corresponds to that of the common electrode 11, and the vertical projections (not shown) of the first via hole 13 and the second via hole 14 on the base substrate 1 fall within a scope of a vertical projection (not shown) of the connecting electrode 12 on the base substrate 1; although each of the above projections is not shown in this embodiment. FIG. 2 visually shows a positional relationship of the first via hole 13, the second via hole 14 and the connecting electrode 12. Because the vertical projections of the first via hole 13 and the second via hole 14 are in different positions, they are not mutually influenced.

The connecting electrode 12 is mutually insulated from the pixel electrode 6.

In FIG. 2, with the connecting electrode 12 arranged in the pixel electrode layer, the connecting electrode 12 is electrically connected with the common electrode line 3 through the first via hole 13, and the common electrode 11 of the common electrode layer is electrically connected with the connecting electrode 12 through the second via hole 14, so that an electrical connection of the common electrode 11 and the common electrode line 3 is established. Because the first via hole 13 and the second via hole 14 are electrically connected by the connecting electrode 12, hole depths and sizes of the first via hole 13 and the second via hole 14 are reduced in comparison with those of a continuous via hole (via hole 20a as shown in FIG. 1) directly penetrating through both the gate insulating layer 4 and the passivation layer 10, the influence on the coated film layer in the subsequent fabricating process is reduced, and moires are prevented from being produced on the coated film layer, so that the yield of array substrates is increased.

Figure 3:
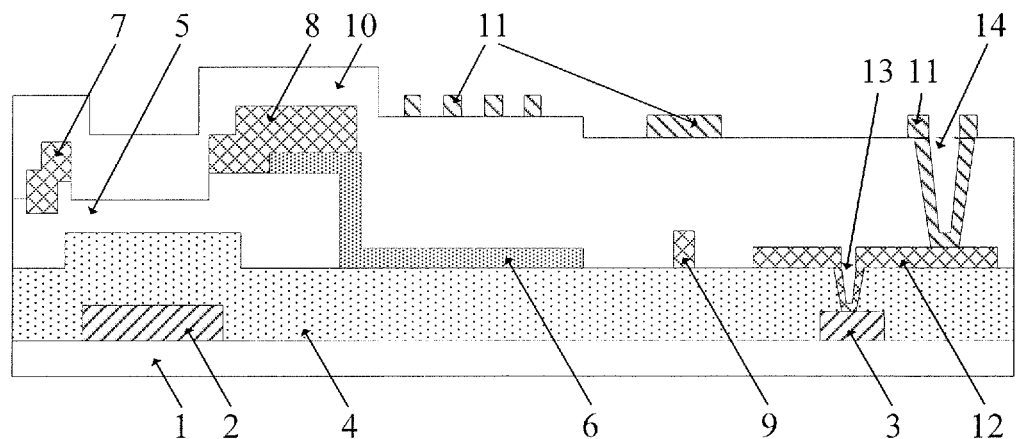
FIG. 3 is a structural schematic diagram of a second array substrate provided in an embodiment of the present disclosure.

With reference to FIG. 3, an array substrate provided in an embodiment of the present disclosure comprises a base substrate 1, and a gate metal layer, a gate insulating layer 4, an active layer 5, a pixel electrode layer, a source-drain electrode metal layer, a passivation layer 10 and a common electrode layer which are sequentially formed on the base substrate 1; the gate metal layer includes a gate electrode 2 and a common electrode line 3; the pixel electrode layer includes a pixel electrode 6; the source-drain electrode metal layer includes a source electrode 7, a drain electrode 8 and a data line 9; the common electrode layer includes a common electrode 11; and the source electrode 7, the drain electrode 8, the gate electrode 2 and the active layer 5 form a TFT.

The pixel electrode layer further includes a connecting electrode 12, the connecting electrode 12 is electrically connected with the common electrode line 3 through a first via hole 13 in the gate insulating layer, and the connecting electrode 12 is electrically connected with the common electrode 11 of the common electrode layer through a second via hole 14 in the passivation layer. In this embodiment, the connecting electrode 12 and the source electrode 7, the drain electrode 8 and the data line 9 are arranged in a same layer.

According to FIG. 3, the connecting electrode 12 is in direct contact with the gate insulating layer 4 and the passivation layer 10 and is arranged outside a region of the active layer 5 and the pixel electrode 6.

Vertical projections (not shown) of the first via hole 13 and the second via hole 14 on the base substrate 1 are mutually staggered, the position of the first via hole 13 corresponds to that of the common electrode line 3, the position of the second via hole corresponds to that of the common electrode 11, the vertical projections (not shown) of the first via hole 13 and the second via hole 14 on the base substrate 1 fall within a scope of a vertical projection (not shown) of the connecting electrode 12 on the base substrate 1; although each of the above projections is not shown in the embodiment, FIG. 3 visually shows a positional relationship of the first via hole 13, the second via hole 14 and the connecting electrode 12. Because the vertical projections of the first via hole 13 and the second via hole 14 are in different positions, they are not mutually influenced.

The connecting electrode 12 is mutually insulated from the source electrode 7, the drain electrode 8 and the data line 9.

In FIG. 3, with the connecting electrode 12 arranged in the source-drain electrode metal layer, the connecting electrode 12 is electrically connected with the common electrode line 3 through the first via hole 13, and the common electrode 11 of the common electrode layer is electrically connected with the connecting electrode 12 through the second via hole 14, so that an electrical connection of the common electrode 11 and the common electrode line 3 is established. Because the first via hole 13 and the second via hole 14 are electrically connected by the connecting electrode 12, hole depths and sizes of the first via hole 13 and the second via hole 14 are reduced in comparison with those of a continuous via hole (via hole 20a as shown in FIG. 1) directly penetrating through both the gate insulating layer 4 and the passivation layer 10, the influence on the coated film layer in the subsequent fabricating process is reduced, and moires are prevented from being produced on the coated film layer, so that the yield of array substrates is increased.

Figure 4:
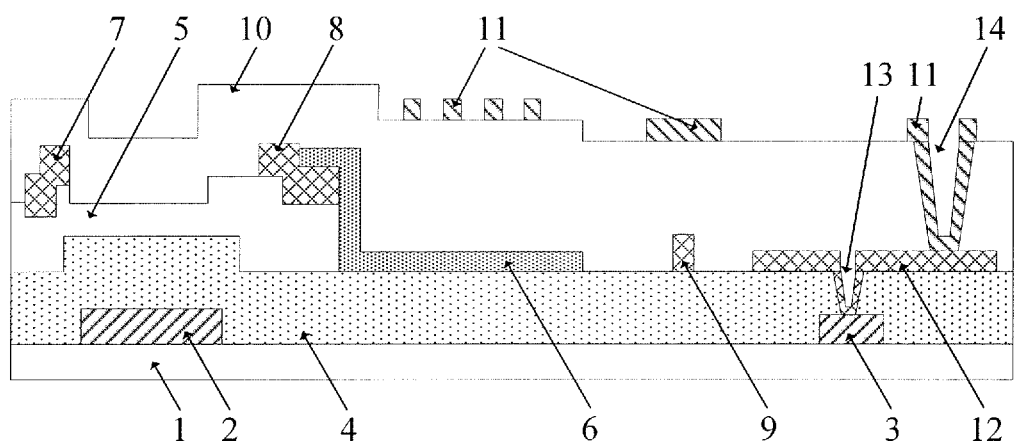
FIG. 4 is a structural schematic diagram of a third array substrate provided in an embodiment of the present disclosure.

With reference to FIG. 4, an array substrate provided in an embodiment of the present disclosure comprises a base substrate 1, and a gate metal layer, a gate insulating layer 4, an active layer 5, a source-drain electrode metal layer, a pixel electrode layer, a passivation layer 10 and a common electrode layer which are sequentially formed on the base substrate 1; the gate metal layer includes a gate electrode 2 and a common electrode line 3; the source-drain electrode metal layer includes a source electrode 7, a drain electrode 8 and a data line 9; the pixel electrode layer includes a pixel electrode 6; the common electrode layer includes a common electrode 11; and the source electrode 7, the drain electrode 8, the gate electrode 2 and the active layer 5 form a TFT.

The source-drain electrode metal layer further includes a connecting electrode 12, the connecting electrode 12 is electrically connected with the common electrode line 3 through a first via hole 13 in the gate insulating layer, and the connecting electrode 12 is electrically connected with the common electrode 11 of the common electrode layer through a second via hole 14 in the passivation layer. In this embodiment, the connecting electrode 12 and the source electrode 7, the drain electrode 8 and the data line 9 are arranged in a same layer.

According to FIG. 4, the connecting electrode 12 is in direct contact with the gate insulating layer 4 and the passivation layer 10 and is arranged outside a region of the active layer 5 and the pixel electrode 6.

Vertical projections (not shown) of the first via hole 13 and the second via hole 14 on the base substrate 1 are mutually staggered, the position of the first via hole 13 corresponds to that of the common electrode line 3, the position of the second via hole corresponds to that of the common electrode 11, the vertical projections (not shown) of the first via hole 13 and the second via hole 14 on the base substrate 1 fall within a scope of a vertical projection (not shown) of the connecting electrode 12 on the base substrate 1; although each of the above projections is not shown in the embodiment, FIG. 3 visually shows a positional relationship of the first via hole 13, the second via hole 14 and the connecting electrode 12. Because the vertical projections of the first via hole 13 and the second via hole 14 are in different positions, they are not mutually influenced.

The connecting electrode 12 is mutually insulated from the source electrode 7, the drain electrode 8 and the data line 9.

In FIG. 4, with the connecting electrode 12 arranged in the source-drain electrode metal layer, the connecting electrode 12 is electrically connected with the common electrode line 3 through the first via hole 13, and the common electrode 11 of the common electrode layer is electrically connected with the connecting electrode 12 through the second via hole 14, so that an electrical connection of the common electrode 11 and the common electrode line 3 is established. Because the first via hole 13 and the second via hole 14 are electrically connected by the connecting electrode 12, hole depths and sizes of the first via hole 13 and the second via hole 14 are reduced in comparison with those of a continuous via hole (via hole 20a as shown in FIG. 1) directly penetrating through both the gate insulating layer 4 and the passivation layer 10, the influence on the coated film layer in the subsequent fabricating process is reduced, and moires are prevented from being produced on the coated film layer, so that the yield of array substrates is increased.

Figure 5:
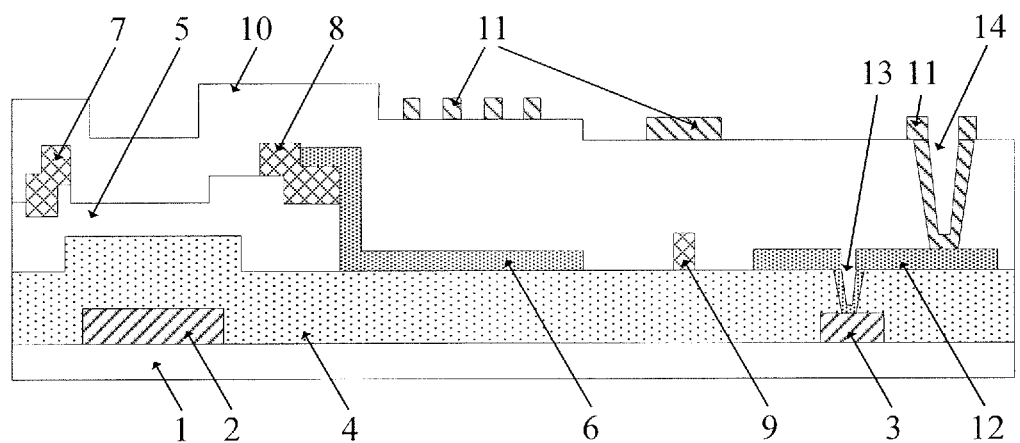
FIG. 5 is a schematic structural diagram of a fourth array substrate provided in an embodiment of the present disclosure.

With reference to FIG. 5, an array substrate provided in an embodiment of the present disclosure comprises a base substrate 1, and a gate metal layer, a gate insulating layer 4, an active layer 5, a source-drain electrode metal layer, a pixel electrode layer, a passivation layer 10 and a common electrode layer which are sequentially formed on the base substrate 1; the gate metal layer includes a gate electrode 2 and a common electrode line 3, the source-drain electrode metal layer includes a source electrode 7, a drain electrode 8 and a data line 9; the pixel electrode layer includes a pixel electrode 6; the common electrode layer includes a common electrode 11; and the source electrode 7, the drain electrode 8 the gate electrode 2 and the active layer 5 form a thin film transistor (TFT).

The pixel electrode layer further includes a connecting electrode 12, the connecting electrode 12 is electrically connected with the common electrode line 3 through a first via hole 13 in the gate insulating layer, and the connecting electrode 12 is electrically connected with the common electrode 11 of the common electrode layer through a second via hole 14 in the passivation layer. In this embodiment, the connecting electrode 12 and the pixel electrode 6 are arranged in a same layer.

According to FIG. 5, the connecting electrode 12 is in direct contact with the gate insulating layer 4 and the passivation layer 10 and is arranged outside a region of the active layer 5 and the pixel electrode 6.

Vertical projections (not shown) of the first via hole 13 and the second via hole 14 on the base substrate 1 are mutually staggered, the position of the first via hole 13 corresponds to that of the common electrode line 3, the position of the second via hole corresponds to that of the common electrode 11, the vertical projections (not shown) of the first via hole 13 and the second via hole 14 on the base substrate 1 fall within a scope of a vertical projection (not shown) of the connecting electrode 12 on the base substrate 1; although each of the above projections is not shown in the embodiment, FIG. 2 visually shows a positional relationship of the first via hole 13, the second via hole 14 and the connecting electrode 12. Because the vertical projections of the first via hole 13 and the second via hole 14 are in different positions, they are not mutually influenced.

The connecting electrode 12 is mutually insulated from the pixel electrode 6.

In FIG. 5, with the connecting electrode 12 arranged in the pixel electrode layer, the connecting electrode 12 is electrically connected with the common electrode line 3 through the first via hole 13, and the common electrode 11 of the common electrode layer is electrically connected with the connecting electrode 12 through the second via hole 14, so that an electrical connection of the common electrode 11 and the common electrode line 3 is established. Because the first via hole 13 and the second via hole 14 are electrically connected by the connecting electrode 12, hole depths and sizes of the first via hole 13 and the second via hole 14 are reduced in comparison with those of a continuous via hole (via hole 20*a* as shown in FIG. 1) directly penetrating through both the gate insulating layer 4 and the passivation layer 10, the influence on the coated film layer in the subsequent fabricating process is reduced, and moires are prevented from being produced on the coated film layer, so that the yield of array substrates is increased.

An embodiment of the present disclosure further provides a display panel, comprising the array substrate provided by any of the above embodiments. Certainly, the display panel provided by the embodiment of the present disclosure may further comprise a color filter substrate, a liquid crystal, and other commonly used components, which will not be described in detail herein.

In the display panel provided by the embodiment of the present disclosure, a pixel electrode layer or a source-drain electrode metal layer is provided with a connecting electrode, the connecting electrode is electrically connected with a common electrode line through a first via hole, and the common electrode is electrically connected with the connecting electrode through a second via hole, so that an electrical connection of the common electrode and the common electrode line is established. Because the first via hole and the second via hole are respectively arranged in different layers and are electrically connected through the connecting electrode, hole depths and sizes of the first via hole and the second via hole are reduced in comparison with those of a continuous via hole directly penetrating through both the gate insulating layer and the passivation layer, the influence on the coated film layer in the subsequent fabricating process is reduced, and moires are prevented from being produced on the coated film layer, so that the yield of array substrates is increased.

An embodiment of the present disclosure further provides a display apparatus, comprising the display panel provided by the above embodiment. The display apparatus according to the embodiment of the present disclosure may further comprise a backlight module, a frame, a base and the like, which will not be described in detail herein.

In the display apparatus according to the embodiment of the present disclosure, a connecting electrode is arranged between a gate insulating layer and a passivation layer of the array substrate, the connecting electrode is electrically connected with a common electrode line through a first via hole, and the common electrode is electrically connected with the connecting electrode through a second via hole, so that an electrical connection of the common electrode and the common electrode line is established. Because the first via hole and the second via hole are respectively arranged in different layers and are electrically connected through the connecting electrode, the hole depths and the sizes of the first via hole and the second via hole are reduced in comparison with those of a continuous via hole directly penetrating through both the gate insulating layer and the passivation layer, the influence on the coated film layer in the subsequent fabricating process is reduced, and moires are prevented from being produced on the coated film layer, so that the yield of array substrates is increased.

An embodiment of the present disclosure further provides a fabricating method of an array substrate. The fabricating method comprises: sequentially forming a gate metal layer, a gate insulating layer, an active layer, a source-drain electrode metal layer, a passivation layer and a common electrode layer on a base substrate, and forming a pixel electrode layer between the active layer and the source-drain electrode metal layer or between the source-drain electrode metal layer and the passivation layer, the gate metal layer including a gate electrode and a common electrode line.

Additionally, the fabricating method further comprises: forming a connecting electrode in the pixel electrode layer or the source-drain electrode metal layer, forming a first via hole in the gate insulating layer, and forming a second via hole in the passivation layer, the connecting electrode being electrically connected with the common electrode line through the first via hole in the gate insulating layer, and the connecting electrode being electrically connected with a common electrode of the common electrode layer through the second via hole in the passivation layer.

For example, the fabricating method of the array substrate, provided by the embodiment of the present disclosure, comprises following steps:

601: Sequentially forming a gate metal layer on the base substrate, the gate metal layer including a gate electrode and a common electrode line.

602: Sequentially forming a gate insulating layer and an active layer on the gate metal layer.

603: Forming a first via hole in a region of the gate insulating layer outside the active layer, a position of the first via hole corresponding to that of the common electrode line.

604: Forming a pixel electrode layer including a pixel electrode and a connecting electrode on the base substrate on which the above-described steps have been completed, the connecting electrode being electrically connected with the common electrode line through the first via hole.

The connecting electrode is mutually insulated from the pixel electrode.

605: Forming a source-drain electrode metal layer including a source electrode, a drain electrode and a data line on the base substrate on which the above-described steps have been completed.

606: Forming a passivation layer on the base substrate on which the above-described steps have been completed, the passivation layer including a second via hole corresponding to the connecting electrode.

Vertical projections of the second via hole and the first via hole on the base substrate are mutually staggered and fall within a scope of a vertical projection of the connecting electrode on the base substrate.

607: Forming a common electrode layer comprising a common electrode on the base substrate where the above-described steps have been formed, the common electrode being electrically connected with the connecting electrode through the second via hole.

The structure of the array substrate fabricated by the steps 601-607 is shown in FIG. 2.

In the fabricating method of the array substrate according to the embodiment of the present disclosure, with the connecting electrode arranged in the pixel electrode layer, the connecting electrode is electrically connected with the common electrode line through the first via hole, and the common electrode of the common electrode layer is electrically connected with the connecting electrode through the second via hole, so that an electrical connection of the common electrode and the common electrode line is established. Because the first via hole and the second via hole are electrically connected by the connecting electrode, hole depths and sizes of the first via hole and the second via hole are reduced in comparison with those of a continuous via hole directly penetrating through both the gate insulating layer and the passivation layer, the influence on the coated film layer in the subsequent fabricating process is reduced, and moires are prevented from being produced on the coated film layer, so that the yield of array substrates is increased; further, the connecting electrode and the pixel electrode are in a same layer and are synchronously thrilled, so that fabricating procedures and material consumption are reduced.

For example, the fabricating method of the array substrate, provided by the embodiment of the present disclosure, comprises following steps:

701: Sequentially forming a gate metal layer on the base substrate, the gate metal layer including a gate electrode and a common electrode line.

702: Sequentially forming a gate insulating layer and an active layer on the gate metal layer.

703: Forming a first via hole in a region of the gate insulating layer outside the active layer, a position of the first via hole corresponding to that of the common electrode line.

704: Forming a source-drain electrode metal layer including a source electrode, a drain electrode, a data line and a connecting electrode on the base substrate on which the above-described steps have been completed, the connecting electrode being electrically connected with the common electrode line through the first via hole.

The connecting electrode is mutually insulated from the source electrode, the drain electrode and the data line.

705: Forming a pixel electrode layer including a pixel electrode on the base substrate on which the above-described steps have been completed.

706: Forming a passivation layer on the base substrate on which the above-described steps have been completed, the passivation layer including a second via hole corresponding to the connecting electrode.

Vertical projections of the second via hole and the first via hole on the base substrate are mutually staggered, and fall within a scope of a vertical projection of the connecting electrode on the base substrate.

707: Forming a common electrode layer including a common electrode on the base substrate on which the above-described steps have been completed, the common electrode being electrically connected with the connecting electrode through the second via hole.

In the fabricating method of the array substrate according to the embodiment of the present disclosure, with the connecting electrode arranged in the source-drain electrode metal layer, the connecting electrode is electrically connected with the common electrode line through the first via hole, and the common electrode of the common electrode layer is electrically connected with the connecting electrode through the second via hole, so that an electrical connection of the common electrode and the common electrode line is established. Because the first via hole and the second via hole are electrically connected by the connecting electrode, the hole depths and the sizes of the first via hole and the second via hole are reduced in comparison with those of a continuous via hole directly penetrating through both the gate insulating layer and the passivation layer, the influence on the coated film layer in the subsequent fabricating process is reduced, and moires are prevented from being produced on the coated film layer, so that the yield of array substrates is increased; further, the connecting electrode, and the source electrode, the drain electrode and the data line are in a same layer and are synchronously formed, so that fabricating procedures and material consumption are reduced.

The structure of the array substrate fabricated by the steps 701-707 is shown in FIG. 4.

For example, the fabricating method of the array substrate, provided by the embodiment of the present disclosure, comprises following steps:

801: Sequentially forming a gate metal layer on the base substrate, the gate metal layer including a gate electrode and a common electrode line.

802: Forming a gate insulating layer, an active layer, and a pixel electrode layer including a pixel electrode on the gate metal layer.

803: Forming a first via hole in a region of the gate insulating layer outside the active layer and the pixel electrode, a position of the first via hole corresponding to that of the common electrode line.

804: Forming a source-drain electrode metal layer including a source electrode, a drain electrode, a data line and a connecting electrode on the base substrate where the above-described steps have been formed, the connecting electrode being electrically connected with the common electrode line through the first via hole.

The connecting electrode is mutually insulated from the source electrode, the drain electrode and the data line.

805: Forming a passivation layer on the base substrate on which the above-described steps have been completed, the passivation layer including a second via hole corresponding to the connecting electrode.

Vertical projections of the second via hole and the first via hole on the base substrate are mutually staggered, and fall within a scope of a vertical projection of the connecting electrode on the base substrate.

806: Forming a common electrode layer including a common electrode on the base substrate on which the above-described steps have been completed, the common electrode being electrically connected with the connecting electrode through the second via hole.

In the fabricating method of the array substrate according to the embodiment of the present disclosure, with the connecting electrode arranged in the source-drain electrode metal layer, the connecting electrode is electrically connected with the common electrode line through the first via hole, and the common electrode of the common electrode layer is electrically connected with the connecting electrode through the second via hole, so that an electrical connection of the common electrode and the common electrode line is established. Because the first via hole and the second via hole are electrically connected by the connecting electrode, the hole depths and the sizes of the first via hole and the second via hole are reduced in comparison with those of a continuous via hole directly penetrating through both the gate insulating layer and the passivation layer, the influence on the coated film layer in the subsequent fabricating process is reduced, and moires are prevented from being produced on the coated film layer, so that the yield of array substrates is increased; further, the connecting electrode and the source electrode, the drain electrode and the data line are in a same layer and are synchronously formed, so that fabricating procedures and material consumption are reduced.

The structure of the array substrate fabricated by the steps 801-806 is shown in FIG. 3.

For example, the fabricating method of the array substrate, provided by the embodiment of the present disclosure, comprises following steps:

901: Sequentially forming a gate metal layer on the base substrate, the gate metal layer including a gate electrode and a common electrode line.

902: Forming a gate insulating layer, an active layer, and a source-drain electrode metal layer including a source electrode, a drain electrode and a data line on the gate metal layer.

903: Forming a first via hole in a region of the gate insulating layer outside the active layer and the data line.

The position of the first via hole corresponds to that of the common electrode line.

904: Forming a pixel electrode layer including a pixel electrode and a connecting electrode on the base substrate on which the above-described steps have been completed, the connecting electrode being electrically connected with the common electrode line through the first via hole.

The connecting electrode is mutually insulated from the pixel electrode.

905: Forming a passivation layer on the base substrate on which the above-described steps have been completed, the passivation layer including a second via hole corresponding to the connecting electrode.

Vertical projections of the second via hole and the first via hole on the base substrate are mutually staggered, and fall within a scope of a vertical projection of the connecting electrode on the base substrate.

906: Forming a common electrode layer including a common electrode on the base substrate on which the above-described steps have been completed, the common electrode being electrically connected with the connecting electrode through the second via hole.

In the fabricating method of the array substrate according to the embodiment of the present disclosure, by the connecting electrode arranged in the pixel electrode layer, the connecting electrode is electrically connected with the common electrode line through the first via hole, and the common electrode of the common electrode layer is electrically connected with the connecting electrode through the second via hole, so that an electrical connection of the Common electrode and the common electrode line is established. Because the first via hole and the second via hole are electrically connected by the connecting electrode, the hole depths and the sizes of the first via hole and the second via hole are reduced in comparison with those of a continuous via hole directly penetrating through both the gate insulating layer and the passivation layer, the influence on the coated film layer in the subsequent fabricating process is reduced, and moires are prevented from being produced on the coated film layer, so that the yield of array substrates is increased; further, the connecting electrode and the pixel electrode are in a same layer and are synchronously formed, so that fabricating procedures and material consumption are reduced.

The structure of the array substrate fabricated by the steps 901-906 is shown in FIG. 5.

It should be noted that, in the fabricating methods of the array substrate according to the embodiments of the present disclosure, the gate insulating layer and the first via hole therein and the passivation layer and the second via hole therein may be formed by processes such as coating and etching, the gate metal layer and the source-drain electrode metal layer may be formed by processes such as sputtering, etching and the like, and the active layer, the pixel electrode layer and the common electrode layer may be formed by processes such as coating, etching and the like, which will not be described in detail herein.

The foregoing embodiments merely are exemplary embodiments of the present disclosure, and not intended to define the protective scope of the present disclosure, and the protective scope of the present disclosure is determined by the appended claims.

This application claims priority of Chinese Patent Application No. 201410438637.9 filed on Aug. 29, 2014, the present disclosure of which is incorporated herein by reference in its entirety as part of the present application.

The invention claimed is:

1. An array substrate, comprising a base substrate and a gate metal layer, a gate insulating layer, an active layer, a source-drain electrode metal layer, a passivation layer and a common electrode layer which are sequentially formed on the base substrate, as well as a pixel electrode layer which is positioned between the active layer and the source-drain electrode metal layer; the gate metal layer including a gate electrode and a common electrode line; wherein the source-drain electrode metal layer comprises a connecting electrode, the connecting electrode is electrically connected with the common electrode line through a first via hole in the gate insulating layer, and the connecting electrode is electrically connected with a common electrode of the common electrode layer through a second via hole in the passivation layer.

2. The array substrate according to claim 1, wherein the connecting electrode is in direct contact with the gate insulating layer and the passivation layer.

3. The array substrate according to claim 2, wherein vertical projections of the first via hole and the second via hole on the base substrate are mutually staggered, a position of the first via hole corresponds to that of the common electrode line, a position of the second via hole corresponds to that of the common electrode, and the vertical projections of the first via hole and the second via hole on the base substrate fall within a scope of a vertical projection of the connecting electrode on the base substrate.

4. The array substrate according to claim 2, wherein the connecting electrode is positioned in the pixel electrode layer, and the connecting electrode is mutually insulated from a pixel electrode of the pixel electrode layer.

5. The array substrate according to claim 2, wherein the connecting electrode is positioned in the source-drain electrode metal layer, and the connecting electrode is mutually insulated from a source electrode, a drain electrode and a data line in the source-drain electrode metal layer.

6. The array substrate according to claim 1, wherein vertical projections of the first via hole and the second via hole on the base substrate are mutually staggered, a position of the first via hole corresponds to that of the common electrode line, a position of the second via hole corresponds to that of the common electrode, and the vertical projections of the first via hole and the second via hole on the base substrate fall within a scope of a vertical projection of the connecting electrode on the base substrate.

7. The array substrate according to claim 6, wherein the connecting electrode is positioned in the pixel electrode layer, and the connecting electrode is mutually insulated from a pixel electrode of the pixel electrode layer.

8. The array substrate according to claim 6, wherein the connecting electrode is positioned in the source-drain electrode metal layer, and the connecting electrode is mutually insulated from a source electrode, a drain electrode and a data line in the source-drain electrode metal layer.

9. The array substrate according to claim 1, wherein the connecting electrode is positioned in the pixel electrode layer, and the connecting electrode is mutually insulated from a pixel electrode of the pixel electrode layer.

10. The array substrate according to claim 1, wherein the connecting electrode is positioned in the source-drain electrode metal layer, and the connecting electrode is mutually insulated from a source electrode, a drain electrode and a data line in the source-drain electrode metal layer.

11. A display panel, comprising the array substrate according to claim 1.

12. A display apparatus, comprising the display panel according to claim 11.

13. A fabricating method of an array substrate, comprising: sequentially forming a gate metal layer, a gate insulating layer, an active layer, a source-drain electrode metal layer, a passivation layer and a common electrode layer on a base substrate, and forming a pixel electrode layer between the active layer and the source-drain electrode metal layer, the gate metal layer comprising a gate electrode and a common electrode line, wherein
the fabricating method further comprises: forming a connecting electrode in the source-drain electrode metal layer, forming a first via hole in the gate insulating layer, and forming a second via hole in the passivation layer, the connecting electrode being electrically connected with the common electrode line through the first via hole in the gate insulating layer, and the connecting electrode being electrically connected with a common electrode of the common electrode layer through the second via hole in the passivation layer.

14. The fabricating method of the array substrate according to claim 13, comprising:
forming the gate metal layer on the base substrate, the gate metal layer comprising a gate electrode and the common electrode line;
sequentially forming the gate insulating layer and the active layer on the gate metal layer;
forming the first via hole in a region of the gate insulating layer outside the active layer, a position of the first via hole corresponding to that of the common electrode line;
forming the pixel electrode layer comprising a pixel electrode and the connecting electrode on the base substrate, the connecting electrode being electrically connected with the common electrode line through the first via hole;
forming the source-drain electrode metal layer comprising a source electrode, a drain electrode and a data line on the base substrate;
forming the passivation layer on the base substrate, the passivation layer comprising the second via hole corresponding to the connecting electrode; and
forming the common electrode layer comprising the common electrode on the base substrate, the common electrode being electrically connected with the connecting electrode through the second via hole.

15. The fabricating method of the array substrate according to claim 13, comprising:
forming the gate metal layer on the base substrate, the gate metal layer comprising a gate electrode and the common electrode line;
sequentially forming the gate insulating layer and the active layer on the gate metal layer;
forming the first via hole in a region of the gate insulating layer outside the active layer, a position of the first via hole corresponding to that of the common electrode line;
forming the source-drain electrode metal layer comprising a source electrode, a drain electrode, a data line and the connecting electrode on the base substrate, the connecting electrode being electrically connected with the common electrode line through the first via hole;
forming the pixel electrode layer comprising a pixel electrode on the base substrate;
forming the passivation layer on the base substrate, the passivation layer comprising the second via hole corresponding to the connecting electrode; and
forming the common electrode layer comprising the common electrode on the base substrate, the common electrode being electrically connected with the connecting electrode through the second via hole.

16. The fabricating method of the array substrate according to claim 13, comprising:
forming the gate metal layer on the base substrate, the gate metal layer comprising a gate electrode and the common electrode line;
sequentially forming the gate insulating layer, the active layer, and the pixel electrode layer comprising a pixel electrode on the gate metal layer;
forming the first via hole in a region of the gate insulating layer outside the active layer and the pixel electrode, a position of the first via hole corresponding to that of the common electrode line;
forming the source-drain electrode metal layer comprising a source electrode, a drain electrode, a data line and the connecting electrode on the base substrate, the connecting electrode being electrically connected with the common electrode line through the first via hole;
forming the passivation layer on the base substrate, the passivation layer comprising the second via hole corresponding to the connecting electrode; and
forming the common electrode layer comprising the common electrode on the base substrate, the common electrode being electrically connected with the connecting electrode through the second via hole.

17. The fabricating method of the array substrate according to claim 13, comprising:
forming the gate metal layer on the base substrate, the gate metal layer comprising a gate electrode and the common electrode line;
sequentially forming the gate insulating layer, the active layer, and the source-drain electrode metal layer comprising a source electrode, a drain electrode and a data line on the gate metal layer;
forming the first via hole in a region of the gate insulating layer outside the active layer and the data line, a position of the first via hole corresponding to that of the common electrode line;
forming the pixel electrode layer comprising a pixel electrode and the connecting electrode on the base substrate, the connecting electrode being electrically connected with the common electrode line through the first via hole;
forming the passivation layer on the base substrate, the passivation layer comprising the second via hole corresponding to the connecting electrode; and
forming the common electrode layer comprising the common electrode on the base substrate, the common electrode being electrically connected with the connecting electrode through the second via hole.

18. The fabricating method of the array substrate according to claim 14, wherein the connecting electrode is mutually insulated from the pixel electrode.

19. The fabricating method of the array substrate according to claim 15, wherein the connecting electrode is mutually insulated from the source electrode, the drain electrode and the data line.

20. The fabricating method of the array substrate according to claim 13, wherein vertical projections of the first via hole and the second via hole on the base substrate are mutually staggered, and the vertical projections of the first via hole and the second via hole on the base substrate fall within a scope of a vertical projection of the connecting electrode on the base substrate.

* * * * *